United States Patent [19]
Wersing et al.

[11] Patent Number: 5,684,302
[45] Date of Patent: Nov. 4, 1997

[54] PYRODETECTOR ELEMENT HAVING A PYROELECTRIC LAYER PRODUCED BY ORIENTED GROWTH, AND METHOD FOR THE FABRICATION OF THE ELEMENT

[75] Inventors: Wolfram Wersing, Kirchheim; Rainer Bruchhaus, München, both of Germany

[73] Assignee: Siemens Aktiengesellschaft, Munich, Germany

[21] Appl. No.: 581,590
[22] PCT Filed: Jul. 8, 1994
[86] PCT No.: PCT/DE94/00785
§ 371 Date: Jan. 16, 1996
§ 102(e) Date: Jan. 16, 1996
[87] PCT Pub. No.: WO95/02904
PCT Pub. Date: Jan. 26, 1995

[30] Foreign Application Priority Data

Jul. 15, 1993 [DE] Germany .................. 43 23 821.1

[51] Int. Cl.⁶ .................. G01J 5/34; H01L 37/02
[52] U.S. Cl. .................. 250/338.3
[58] Field of Search .................. 250/338.3

[56] References Cited

U.S. PATENT DOCUMENTS

| | | | |
|---|---|---|---|
| 3,816,750 | 6/1974 | Liu | 250/338.3 |
| 4,009,516 | 3/1977 | Chiang et al. | 250/338.3 |
| 5,270,298 | 12/1993 | Ramesh | 505/238 |
| 5,387,459 | 2/1995 | Hung | 428/209 |

FOREIGN PATENT DOCUMENTS

| | | |
|---|---|---|
| 0345048 | 12/1989 | European Pat. Off. |
| 93/09414 | 5/1993 | WIPO |

OTHER PUBLICATIONS

D.B. Betts et al., "Infrared Reflection Properties of Five Types of Black Coating for Radiometric Detectors", J. Phys. E. Sci. Instrum., vol. 18, pp. 689–696, 1985.

S. Bauer et al., "A Dünne Metallfilme als Absorber in Infrarotsensoren", Phys. vol. 48, No. 4, pp. 283–284, 1992 no month.

Takayama et al., "Pyroelectric Infrared Array Sensors Made of c–Axis–oriented La–modified $PbTiO_3$ Thin Films", Sensors and Actuators, A21–A23 (1990), pp. 508–512 no month.

Takayama et al., "Preparation and characteristics of pyroelectric infrared sensors made of c–axis oriented La–modified $PbTiO_3$ thin films", Journal of Applied Physics, Bd. 61, Jan. 1987, New York, NY, USA, pp. 411–415.

Y. Xu et al., "Ferroelectric Thin Films on Silicon and Fused Silica Substrates by Sol–Gel Process", Mat. Res. Soc. Symp., vol. 200, 1990, pp. 13–18 no month.

A. Pignolet et al., "Pyroelectricity in $(Pb_{0.98}Mn_{0.02})(Zr_{0.6}Ti_{0.4})O_3$ Sputtered Thin Films", Ferroelectrics, 1992, vol. 128, pp. 37–42 no month.

L. Wang et al., "Properties of $Pb(Zr_xTi_{1-x})O_3$ Thin Films Prepared by R.F. Magnetron Sputtering and Heat Treatment", Mat. Res. Bull., vol. 25, 1990, pp. 1495–1501.

*Primary Examiner*—Carolyn E. Fields
*Attorney, Agent, or Firm*—Hill, Steadman & Simpson

[57] ABSTRACT

A novel pyrodetector element is produced by oriented growth, with the aid of buffer layers, above a monocrystalline silicon substrate and thus enables the fabrication of an array of pyrodetectors having read-out and amplifier circuitry integrated on the common substrate. Proposed as the buffer layers are yttrium-stabilized zirconium oxide YSZ or magnesium oxide above an interlayer made of spinel.

10 Claims, 2 Drawing Sheets

PYRODETECTOR ELEMENT HAVING A PYROELECTRIC LAYER PRODUCED BY ORIENTED GROWTH, AND METHOD FOR THE FABRICATION OF THE ELEMENT

BACKGROUND OF THE INVENTION

1. Field of the Invention

The present invention relates generally to a pyrodetector element which is composed of an oriented pyroelectric thin film.

2. Description of the Related Art

A pyrodetector comprises an active sensor layer which is made of a pyroelectric material which on both sides is faced with an electrode. Pyroelectric materials used include, for example, lead zirconium titanates (PZT), preferably lead titanate or organic pyroelectrics such as poly(vinylidene fluoride) (PVDF). A permanent polarization of the pyroelectric is possible in a strong electric field or is automatically established in the process of oriented growth of the pyroelectric.

Absorption of infrared radiation in a pyrodetector gives rise to a temperature increase which causes a change in the polarization of the pyroelectric material, a voltage building up which can be read off at the two electrodes. So that a maximum measured signal is obtained for a given incident radiation, it is necessary, on the one hand, to optimize the pyroelectric properties of the material. Since, on the other hand, the extent of the temperature increase caused by the absorption of the IR radiation likewise affects the size of the measured signal, pyrodetectors are additionally optimized in terms of as small a thermal capacity as possible. This is normally achieved by reducing the layer thicknesses of the detector element and by etch-back of the substrate on which the detector element is usually built up. Thus, for example, detector elements having "free-floating" polysilicon membranes at a distance of approximately 1 μm from the substrate surface are known. Etching of thin silicon membranes and free-standing tongues made of silicon, and etching of troughs in the silicon substrate underneath the pyroelectric layer are likewise known. So as to etch the substrate selectively with respect to the pyroelectric layer or with respect to the first electrode layer, assembly of the detector element is preceded by building up, on the substrate, of an additional etch stop layer which, for example, is an amorphous layer of silicon dioxide or silicon nitride.

In order for pyrodetectors having good electrical properties to be obtained, which produce large currents as the measured signals, the direction of polarization of the pyroelectric should be perpendicular to the electrode faces and thus be perpendicular to the substrate surface. Since the polarization of the perovskites from the PZT family can adopt only certain directions in the crystal, the pyroelectric layer must be applied to the substrate in at least an oriented manner and, even better, epitaxially. This requires certain monocrystalline substrate materials. R. Takayama, Y. Tomita, J. Asayama, K. Nomura and H. Ogawa, "Pyroelectric Infrared Array Sensors Made of c-Axis-oriented La-modified PbTiO$_3$ Thin Films", Sensors and Actuators, A21–A23, 508–512 (1990), disclose a pyroelectric IR detector array on the basis of c-axis-oriented lanthanum-modified lead titanate thin films (PLT). The PLT thin film is here produced by oriented growth on a magnesium oxide single crystal as the substrate. In a subsequent process step, the PLT layer is exposed by etch-back of the magnesium oxide substrate and is faced with an electrode from underneath.

A drawback of this known pyrodetector array is the complicated interconnection of the electrodes, which partially run "underneath the substrate" and which must be connected to an external read-out and analysis circuit.

U.S. Pat. No. 3,816,750 discloses a ceramic pyrodetector, fabricated by hot pressing, on the basis of lanthanum-doped lead zirconate titanate.

Material Research Symposium Proc., Vol. 200 (1990), pages 13 to 18, disclose pyroelectric layers on top of annealed quartz, which are produced by sol-gel processes.

Material Research Symposium Proc., Vol. 243 (1992), pages 107 to 112 disclose the generation of pyroelectric layers by sol-gel processes. A silicon substrate with metal electrodes is employed.

Ferroelectrics, Vol. 128 (1992), pages 37 to 42, disclose the generation of pyroelectric layers on top of a silicon substrate provided with platinum electrodes.

Material Research Bulletin, Vol. 25 (1990), pages 1495 to 1501, disclose pyroelectric PZT layers on silicon or sapphire.

SUMMARY OF THE INVENTION

The problem underlying the present invention is that of providing a thin-film pyrodetector element which is composed of an oriented pyroelectric thin film, has a low thermal capacity and enables simpler, integrated electrical interconnection for the assembly and operation of the detector array.

This and other objects and advantages are achieved according to the invention by a thin-film pyrodetector element having a monocrystalline silicon substrate, an epitaxial buffer layer which is applied above the silicon substrate and is made of yttrium-stabilized zirconium oxide or an epitaxial interlayer which is applied above the silicon substrate and is made of spinel and an at least oriented buffer layer applied thereabove, which is made of magnesium oxide, an oriented or epitaxial first electrode layer, a c-axis-oriented pyroelectric layer of a material selected from the perovskite family and a second electrode layer.

The first electrode layer is preferably made of platinum. Further refinements of the invention and a method for fabricating the pyrodetector element include the pyrodetector element wherein the first electrode layer is made of an electrically conductive oxide from the class of the perovskites having the general empirical formula (LaCa) (MnCo) O$_3$ or (LaPbCa) (MnCoTi) O$_3$ and wherein the pyroelectric layer is made of the same components as the first electrode layer, but has a different cation ratio. Preferably, the first electrode layer and the pyroelectric layer have at least one common region having a cation ratio which changes continuously in the layer thickness direction.

In preferred embodiments, the pyroelectric layer comprises a perovskite material from the family of the lead zirconate titanates. The silicon substrate has, in the region of the active sensor face of the pyrodetector element, a recess which exposes the interlayer or the buffer layer.

The pyrodetector element may form part of an arrangement of a plurality of pyrodetector elements on a common silicon substrate.

A method for fabricating a pyrodetector element of thin-film construction, includes the steps of
providing a monocrystalline silicon substrate,
oriented deposition of a buffer layer made of magnesium oxide,
oriented growth of an interlayer made of spinel,
oriented deposition of a first electrode layer,
oriented growth of a pyroelectric layer made of a pyroelectric material from the family of the perovskites, generating a metallic second electrode layer, etch-back of the silicon substrate underneath the pyrodetector element in the region of the active sensor face of the latter, the buffer layer serving as an etch stop layer, and establishing electrical connections for the electrical interconnection of the two electrode layers.

Alternately, the method for fabricating a pyrodetector element of thin-film construction, may include the steps of providing a monocrystalline silicon substrate, oriented deposition of a buffer layer made of yttrium-stabilized zirconium oxide, oriented deposition of a first electrode layer, oriented growth of a pyroelectric layer made of a pyroelectric material from the family of the perovskites, generating a metallic second electrode layer, etch-back of the silicon substrate underneath the pyrodetector element in the region of the active sensor face of the latter, the buffer layer serving as an etch stop layer, and establishing electrical connections for the electrical interconnection of the two electrode layers.

Either method may be improved wherein, after allover application of the individual layers, at least one photopatterning technique is carried out in order to produce an arrangement of a plurality of mutually separated and consequently mutually thermally insulated pyrodetector elements on the silicon substrate.

Preferably, there are provided, in the silicon substrate, microelectronic read-out and amplifier circuits for the arrangement of the pyrodetector documents on the silicon substrate.

The invention for the first time specifies a pyrodetector element which has been produced by oriented growth on a silicon substrate and therefore permits the additional integration of read-out and analysis circuits for the detector element or for an arrangement of a plurality of pyrodetector elements combined into a pyrodetector array. The selection of suitable buffer layers and/or novel combinations of materials for electrode/pyroelectric layer allows:

a) the generation of thin membranes having a favourable crystal orientation for the deposition of oriented or epitaxial pyroelectric layers, for example lead titanate, b) the introduction of novel electrode materials which, owing to a close structural relationship, enables the deposition of oriented or epitaxial pyroelectric layers.

Previously, the article by Takayama et al. which has been cited above had only disclosed the generation of oriented pyroelectric layers directly on top of monocrystalline magnesium oxide. The combination of materials of the pyroelectric element according to the invention is designed in such a way that, on top of the monocrystalline silicon substrate, it is possible for not only the buffer layer, but also for the electrode layer and the pyroelectric layer to grow in an oriented manner or even epitaxially. The buffer layer additionally permits simple etch-back of the substrate, since it can serve, at the same time, as an etch stop layer in the course of the silicon substrate being etched. In the finished pyrodetector element, the buffer layer forms a thin self-supporting membrane which in turn supports the detector element.

The membrane or the buffer layer can be generated in any thickness required, but usually is of such a thickness that it, together with the active portion of the pyrodetector element, has adequate mechanical stability to bridge the space, that is now "substrate-free" owing to etch-back of the substrate, underneath the active detector region, without the risk of fracture or other damage during operation of the pyrodetector element.

One embodiment of the invention relates to the use of a spinel layer ($MgAl_2O_4$) as an interlayer, on top of which a magnesium oxide layer grows epitaxially or at least in an oriented manner. On top of the magnesium oxide surface the first electrode layer is then applied. Good utility for the first electrode layer is provided by platinum, which grows on top of the magnesium oxide in an oriented to epitaxial manner. For the pyroelectric layer to be applied on top of this a perovskite from the PZT family is selected, for example a lead titanate $PbTiO_3$, which, on top of magnesium oxide or on top of the platinum electrode layer situated therebetween, exhibits oriented growth.

The material for the second or top electrode layer on top of the pyroelectric layer is not critical, since the only other requirement, apart from adequate conductivity, is that it must be compatible with the pyroelectric material, in particular with the lead contained therein, and should absorb incident thermal radiation as effectively as possible. One possibility, for example, is to employ a nickel/chromium alloy for the second electrode layer.

In a further embodiment of the invention the buffer layer that is employed is a fully stabilized yttrium-stabilized zirconium oxide $ZrO_2$ (YSZ), which hitherto was known only as a buffer layer for high-temperature superconductors. Here again, platinum can be employed as the first electrode layer, since it grows in an oriented manner on top of YSZ. The pyroelectric layer is then again formed by a lead titanate, for example by (Pb, Ca) (Ti, Mn) $O_3$.

In a further refinement of the invention, the first electrode layer on top of the YSZ buffer layer is produced from an electron-conducting $ABO_3$ material, manganates and cobaltates being particularly suitable for this purpose. On top of a first electrode layer made of, for example, (La, Ca) $MnO_3$, a lead titanate layer, for example (Pb, Ca) (Ti, Mn) $O_3$ is then applied as the pyroelectric layer.

In a particularly advantageous variation of the embodiment just described, the combination of materials for the electrode/pyroelectric is chosen in such a way that the two layers contain the same cations and differ only by the cation ratio on the A and B site. A combination of materials according to the invention therefore comprises, in a first electrode layer, (La, Pb) (Mn, Ti) $O_3$ and (Pb, La) (Ti, Mn) $O_3$ as the pyroelectric layer. This design results in a particularly simple fabrication, where the electrode and the pyroelectric layer may constitute two different layers or form a single layer having a corresponding cation ratio gradient. In the process, particularly good lattice matching and consequently a particularly highly oriented pyroelectric layer can be produced.

The known thin-film processors are suitable for the generation of the different layers of the pyrodetector elements according to the invention, for example sputtering, MOCVD, sol-gel spin-on, pulsed laser deposition or other gas-phase and plasma deposition processes. The degree of the orientation of the growing layers can be increased by suitably slow growth and suitably chosen growth temperatures.

BRIEF DESCRIPTION OF THE DRAWINGS

The invention is explained below in more detail with reference to illustrative embodiments and the appertaining four figures, in which.

DETAILED DESCRIPTION OF THE PREFERRED EMBODIMENTS

Figure 1:
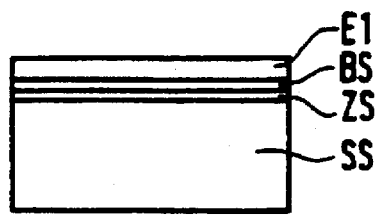
FIGS. 1 to 3 show a schematic cross section through a pyrodetector element according to the invention during various process steps in the course of fabrication and FIG. 4 shows a schematic section through a finished pyrodetector element according to a further embodiment of the invention.

FIG. 1: On top of a monocrystalline silicon substrate SS having a (100)-oriented, polished surface a succession of layers is applied, all over in each case, in accordance with known thin-film processes, for example by being sputtered on, vapour deposition, CVD, MOCVD etc. Directly on top of the silicon substrate SS an interlayer IL made of spinel $MgAl_2O_4$ is applied, on top of this a buffer layer BL made of magnesium oxide MgO, and on top of this the first electrode layer E1. The different layers are applied, if required, with different deposition conditions in terms of temperature, pressure or process, the deposition temperature and the growth rate achieved permitting the growth of at least oriented or, even better, epitaxial layers.

The layer thicknesses of interlayer IL, buffer layer BL and first electrode layer E1 are chosen to be as thin as possible, in order to achieve as good an orientation as possible during growth, in spite of the lattice mismatch. The interlayer IL and the buffer layer BL should, however, be sufficiently thick and mechanically stable to fulfill their membrane function and make it possible for the pyrodetector element or pyrodetector array set up on top thereof to be carried without support, at least over the area of the latter. To achieve this, a layer thickness of 1 μm in total is sufficient. The minimum thickness of the first electrode layer E1 is limited by the electrical conductivity of the material of the first electrode layer. A metallic first electrode layer, for example consisting of platinum, can be made correspondingly thinner, at approximately 100 nm, than, for example, an electrode layer made of an electrically conductive $ABO_3$ compound.

Figure 2:
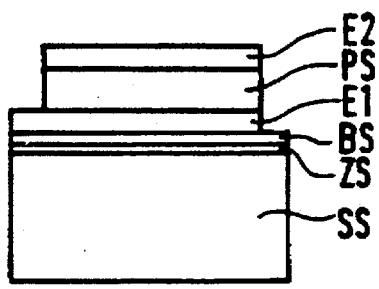

On top of the first electrode layer E1, a pyroelectric layer PL made of a lead titanate is now produced by oriented growth in a thickness of approximately 1 μm, as shown in FIG. 2.

The second electrode layer E2 is applied all over on top of the pyroelectric layer PL, for example by vapor deposition of a metal, and is then patterned with the aid of a photopatterning technique, i.e. by application of a photoresist, image-wise exposure of a desired pattern, developing the photoresist and removing the electrode layer E2 in the regions not covered by photoresist, for example by means of etching. In a further photopatterning step, the uniform pyroelectric layer PL is subdivided into a multiplicity of layer zones corresponding to the individual detectors, for example by etching. The spatial separation of individual detectors in a pyrodetector array is necessary in order to minimize, between two adjacent individual detectors, a thermal bridge and thus the crosstalk during detection of an IR signal.

After the pyroelectric layer has been patterned, the first electrode layer E1 can in turn be patterned by means of photopatterning processes. FIG. 2 shows this arrangement. Alternatively, the bottom electrode can be left covering the whole area.

To connect the second electrode layer E2 to the read-out circuit, application of a suitable electrical insulation is followed by application and patterning of conductor tracks. These additional electrode patterns are not shown in FIG. 2.

To improve the IR absorption of the pyrodetector element, an absorber layer is finally applied which, for example, consists of gold black.

To reduce the thermal capacity and thermal conduction into the substrate of the pyrodetector element, the substrate SS is now etched away in the region of the pyrodetector(s). In so doing, a photoresist technique can be employed to generate a recess in the substrate SS underneath each individual detector or to simultaneously expose a number of individual detectors in larger recesses, or to remove the substrate underneath the number of individual detectors.

In the case of alkaline etching of the silicon substrate SS, the interlayer IL serves as an etch stop layer. The layer structure of the pyrodetector elements, which has been applied to the upper side of the silicon substrate, is protected during this etching step by a suitable covering layer.

Figure 3:
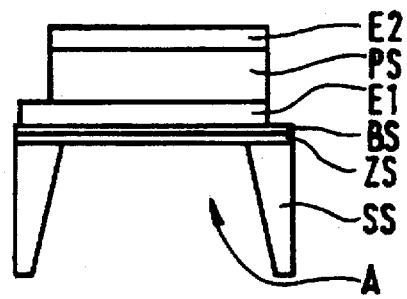

FIG. 3 shows the arrangement after this process step. In the recess R of the silicon substrate SS, the interlayer IL has been exposed in the region of the pyrodetector element (E1, PL, E2). The recess may correspond exactly to the dimensions of the pyrodetector element or may be made somewhat larger or smaller. A suitable base area for an individual pyrodetector element is, for example, 50×50 μm$^2$, a pyrodetector array comprising at least two by two, i.e. four individual detectors. Better spatial resolution of a detected IR signal is achieved with larger arrays, which consist of a greater number of individual detectors.

The circuits required for the operation of a pyrodetector element or a pyrodetector array are preferably integrated on the silicon substrate SS. They essentially comprise read-out circuitry to address the individual detectors and amplifier circuits for amplifying the weak measured signals. The circuits are normally produced prior to the fabrication of the pyrodetector element or the pyrodetector elements.

Figure 4:
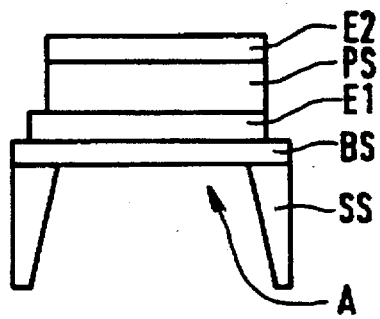

FIG. 4 shows a further embodiment of the invention, where the pyrodetector element comprising the first electrode layer E1, the pyroelectric layer PL and the second electrode layer E2 is constructed on a buffer layer BL made of fully yttrium-stabilized zirconium oxide (YSZ). Here again, the YSZ buffer layer BL serves as an etch stop layer to produce the recess R in the silicon substrate SS.

Figure 5:
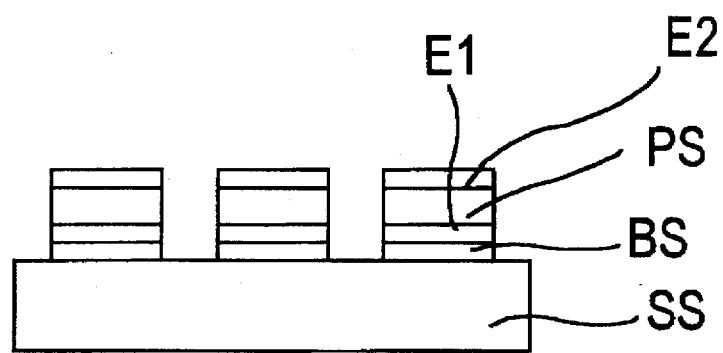
FIG. 5 is a side view of a plurality of pyrodetector elements on a substrate.

A pyrodetector element which is fully integrated and is accommodated, together with the required circuitry, on a single (silicon) substrate, or an arrangement of a plurality of such pyrodetector elements, such as shown in FIG. 5, has the advantage of compact construction, therefore is handier than known pyrodetectors where detectors and the associated electronics are accommodated on separate substrates, can be fabricated more readily and more cost-effectively, and has functional advantages.

The compact construction permits a smaller primary signal from the pyrodetector element to be employed, since the signal can be amplified, in the immediate vicinity of the detector element, by suitable circuitry. The construction of the pyrodetector element as a thin film moreover permits more rapid response of the pyrodetector to incident IR radiation.

Although other modifications and changes may be suggested by those skilled in the art, it is the intention of the inventors to embody within the patent warranted hereon all changes and modifications as reasonably and properly come within the scope of their contribution to the art.

I claim:

1. A pyrodetector element of thin-film construction, comprising:

a) a monocrystalline silicon substrate, b) an epitaxial layer which is applied above the silicon substrate, c) a first electrode layer, d) a c-axis-oriented pyroelectric layer of a perovskite, and e) a second electrode layer, wherein said first electrode layer is of an electrically conductive oxide selected from a class of the perovskites having a general empirical formula (LaCa) (MnCo), $O_3$ and (LaPbCa) (MnCoTi) $O_3$ and wherein said pyroelectric layer is of same components as said first electrode layer, but has a different cation ratio.

2. A pyrodetector element as claimed in claim 1, wherein said first electrode layer and said pyroelectric layer have at least one common region having a cation ratio which changes continuously in a layer thickness direction.

3. A pyrodetector element as claimed in claim 1, wherein said epitaxial layer is an epitaxial buffer layer which is made of yttrium-stabilized zirconium oxide.

4. A pyrodetector element as claimed in claim 1, wherein said first electrode layer is an oriented first electrode layer.

5. A pyrodetector element as claimed in claim 1, wherein said first electrode layer is an epitaxial first electrode layer.

6. A pyrodetector element of thin-film construction, comprising:

a) a monocrystalline silicon substrate, b) an epitaxial layer which is applied above the silicon substrate, c) first electrode layer, d) a c-axis-oriented pyroelectric layer of a perovskite, and e) a second electrode layer, wherein said epitaxial layer is an epitaxial interlayer which is made of spinel and an at least oriented buffer layer applied thereabove, which is made of magnesium oxide.

7. A pyrodetector element as claimed in claim 6, wherein said first electrode layer is of platinum.

8. A pyrodetector element as claimed in claim 6, wherein said pyroelectric layer comprises a perovskite material from the family of lead zirconate titanates.

9. A pyrodetector element as claimed in claim 6, wherein said silicon substrate has, in a region of an active sensor face of said pyrodetector element, means defining a recess which exposes said epitaxial layer.

10. A pyrodetector element as claimed in claim 6, wherein said pyrodetector element is a first element and further comprising a plurality of pyrodetector elements on a common silicon substrate which forms an arrangement with said first element.

* * * * *